United States Patent
Zhu et al.

(10) Patent No.: US 8,295,380 B2
(45) Date of Patent: Oct. 23, 2012

(54) AUTOMATIC GAIN CONTROL CIRCUIT FOR MIMO OFDM RECEIVER

(75) Inventors: Mingrui Zhu, Sunnyvale, CA (US); Gwang-Hyun Gho, Cupertino, CA (US); Won-Joon Choi, Cupertino, CA (US)

(73) Assignee: Amicus Wireless Technology Ltd (KY)

( * ) Notice: Subject to any disclaimer, the term of this patent is extended or adjusted under 35 U.S.C. 154(b) by 1174 days.

(21) Appl. No.: 12/114,929

(22) Filed: May 5, 2008

(65) Prior Publication Data

US 2008/0273636 A1    Nov. 6, 2008

Related U.S. Application Data

(60) Provisional application No. 60/927,495, filed on May 4, 2007.

(51) Int. Cl.
*H04B 7/02* (2006.01)

(52) U.S. Cl. ........ 375/267; 375/260; 375/259; 375/295; 375/316; 375/345; 375/326; 375/327; 375/341

(58) Field of Classification Search .................. 375/267, 375/260, 259, 295, 316, 345, 326, 327, 341; 455/250, 240, 232
See application file for complete search history.

(56) References Cited

U.S. PATENT DOCUMENTS

| | | |
|---|---|---|
| 2002/0090042 A1 | 7/2002 | Heinonen et al. |
| 2006/0135081 A1 | 6/2006 | Mysore et al. |
| 2007/0066259 A1 | 3/2007 | Ryan et al. |
| 2008/0232518 A1* | 9/2008 | Kim et al. ..................... 375/345 |

\* cited by examiner

*Primary Examiner* — Zewdu Kassa

(74) *Attorney, Agent, or Firm* — Thomas H. Ham; Wilson Ham & Holman

(57) ABSTRACT

An automatic gain control (AGC) circuit and method for performing AGC for an orthogonal frequency-division multiplexing (OFDM) receiver measures signal power of input digital signals that are derived from incoming data frames with preambles to produce gain change signals when the signal power differs from a reference target power level. The gain of an amplifier of the OFDM receiver is changed in response to the gain change signals until a preamble of the data frames is detected for the first time. The gain of the amplifier of the OFDM receiver is further changed in response to the gain change signals, after the preamble is detected, only during periods when the preambles of the data frames are being processed by the OFDM receiver such that the gain of the amplifier is not changed during periods when other portions of the data frames are being processed by the OFDM receiver.

24 Claims, 5 Drawing Sheets

AUTOMATIC GAIN CONTROL CIRCUIT FOR MIMO OFDM RECEIVER

CROSS REFERENCE TO RELATED APPLICATION

This application is entitled to the benefit of U.S. Provisional Patent Application Ser. No. 60/927,495, filed on May 4, 2007, which is incorporated herein by reference.

BACKGROUND OF THE INVENTION

Orthogonal Frequency Division Multiple Access (OFDMA) technology is getting very popular in modern communication systems since the OFDMA technology can efficiently support multiple mobile stations with limited bandwidth and easily provide Quality of Service (QoS). The OFDMA technology is a multiple access version of orthogonal frequency-division multiplexing (OFDM). OFDM is a modulation technique for data transmission based on frequency-division multiplexing (FDM), which uses different frequency channels to transmit multiple streams of data. In OFDM systems, a wide channel is divided into multiple narrow-band subcarriers, which allow orthogonal modulated streams of data to be transmitted in parallel on the subcarriers.

At an OFDM transmitter, outgoing information is assembled into blocks of N complex number, one for each subcarrier. An N-point inverse fast Fourier transform (IFFT) is performed on each block, and the resultant time domain signal is transmitted. Usually, several blocks are grouped to form a frame, and one extra block with known pattern, which is referred to as "preamble", is inserted into every frame for acquisition and channel estimation purposes.

At an OFDM receiver, a digital automatic gain control (AGC) circuit measures the strength of the base-band signal at an analog-to-digital (ADC) output, and adjusts the gain to an appropriate level for a range of input signal levels based on the average signal strength of the preamble. There are a number of factors that affect the design of a digital AGC circuit, where performance, speed and complexity are the three main factors.

Multiple-input multiple-output (MIMO) in wireless links is rapidly becoming the new frontier of wireless communications as well. MIMO is an antenna technology for wireless communications in which multiple antennas are used at both the transmitter and the receiver. In properly designed MIMO systems, where there are $N_t$ antennas at the transmitter and $N_r$ antennas at the receiver, $N_t$ times $N_r$ independent air-links are available so that significant diversity gain, spatial multiplexing gain, and array gain are possible. Traditional single antenna system is usually referred to as SISO (single-input single-output).

MIMO OFDMA system is a combination of both state-of-the-art technologies. To realize the significant performance gain at the receiver's side, a MIMO AGC should have the capability to track the strength of the signals from all antennas. Complexity is a major issue for a MIMO AGC.

Thus, there is a need for a digital multi-chain AGC circuit for an OFDM receiver having good performance and convergence speed with reduced complexity.

SUMMARY OF THE INVENTION

An automatic gain control (AGC) circuit and method for performing AGC for an orthogonal frequency-division multiplexing (OFDM) receiver measures signal power of input digital signals that are derived from incoming data frames with preambles to produce gain change signals when the signal power differs from a reference target power level. The gain of an amplifier of the OFDM receiver is changed in response to the gain change signals until a preamble of the data frames is detected for the first time. The gain of the amplifier of the OFDM receiver is further changed in response to the gain change signals, after the preamble is detected, only during periods when the preambles of the data frames are being processed by the OFDM receiver such that the gain of the amplifier is not changed during periods when other portions of the data frames are being processed by the OFDM receiver.

An AGC circuit for an OFDM receiver in accordance with an embodiment of the invention comprises a signal power measuring unit and a finite state machine. The signal power measuring unit is configured to measure signal power of input digital signals that are derived from incoming data frames with preambles. The signal power measuring unit is configured to produce gain change signals when the signal power differs from a reference target power level. The finite state machine is operably connected to the signal power measuring unit to receive the gain change signals. The finite state machine is configured to change the gain of an amplifier of the OFDM receiver in response to the gain change signals until a preamble of the data frames is detected for the first time. The finite state machine is further configured to change the gain of the amplifier in response to the gain change signals, after the preamble is detected, only during periods when the preambles of the data frames are being processed by the OFDM receiver such that the gain of the amplifier is not changed during periods when other portions of the data frames are being processed by the OFDM receiver.

A method for performing AGC for an OFDM receiver in accordance with an embodiment of the invention comprises measuring signal power of input digital signals that are derived from incoming data frames with preambles to produce gain change signals when the signal power differs from a reference target power level, changing the gain of an amplifier of the OFDM receiver in response to the gain change signals until a preamble of the data frames is detected for the first time, and further changing the gain of the amplifier of the OFDM receiver in response to the gain change signals, after the preamble is detected, only during periods when the preambles of the data frames are being processed by the OFDM receiver such that the gain of the amplifier is not changed during periods when other portions of the data frames are being processed by the OFDM receiver.

An OFDM receiver in accordance with an embodiment of the invention comprises a plurality of receiver radio frequency integrated circuits (RFICs) and an AGC circuit. The RFICs are connected to respective antennas. Each of the RFICs includes at least one amplifier. Each of the RFICs is part of a receiver chain. The AGC circuit is configured to change the gain of the at least one amplifier in each of the RFICS. The AGC circuit comprises a plurality of signal power measuring units connected to the RFICs and a synchronous multiple-input multiple-output (MIMO) finite state machine. Each of the signal power measuring units is configured to measure signal power of input digital signals that are derived from incoming data frames with preambles. The signal power measuring unit is configured to produce gain change signals when the signal power differs from a reference target power level. The synchronous MIMO finite state machine is operably connected to the signal power measuring units to receive the gain change signals. The synchronous MIMO finite state machine is configured to change the gain of the at least one amplifier in each of the RFICs in response to the gain change signals until a preamble of the data frames is detected for the first time. The synchronous MIMO finite state machine is further configured to change the gain of the at least one amplifier in each of the RFICs in response to the gain change signals, after the preamble is detected, only during periods when the preambles of the data frames are being processed such that the gain of the at least one amplifier in each of the RFICs is not changed during periods when other portions of the data frames are being processed.

Traditional MIMO AGC design uses independent finite state machine for each independent receiver chain. Therefore, the number of states in the MIMO AGC finite state machine is the product of the number of state of all SISO AGC finite state machines. In this invention, one single finite state machine is implemented to control all the receiver chains. In other words, there is one "global" synchronous finite state machine operate on all receiver chains, which has the same number of states as a SISO AGC.

Other aspects and advantages of the present invention will become apparent from the following detailed description, taken in conjunction with the accompanying drawings, illustrated by way of example of the principles of the invention.

DETAILED DESCRIPTION

Figure 1:
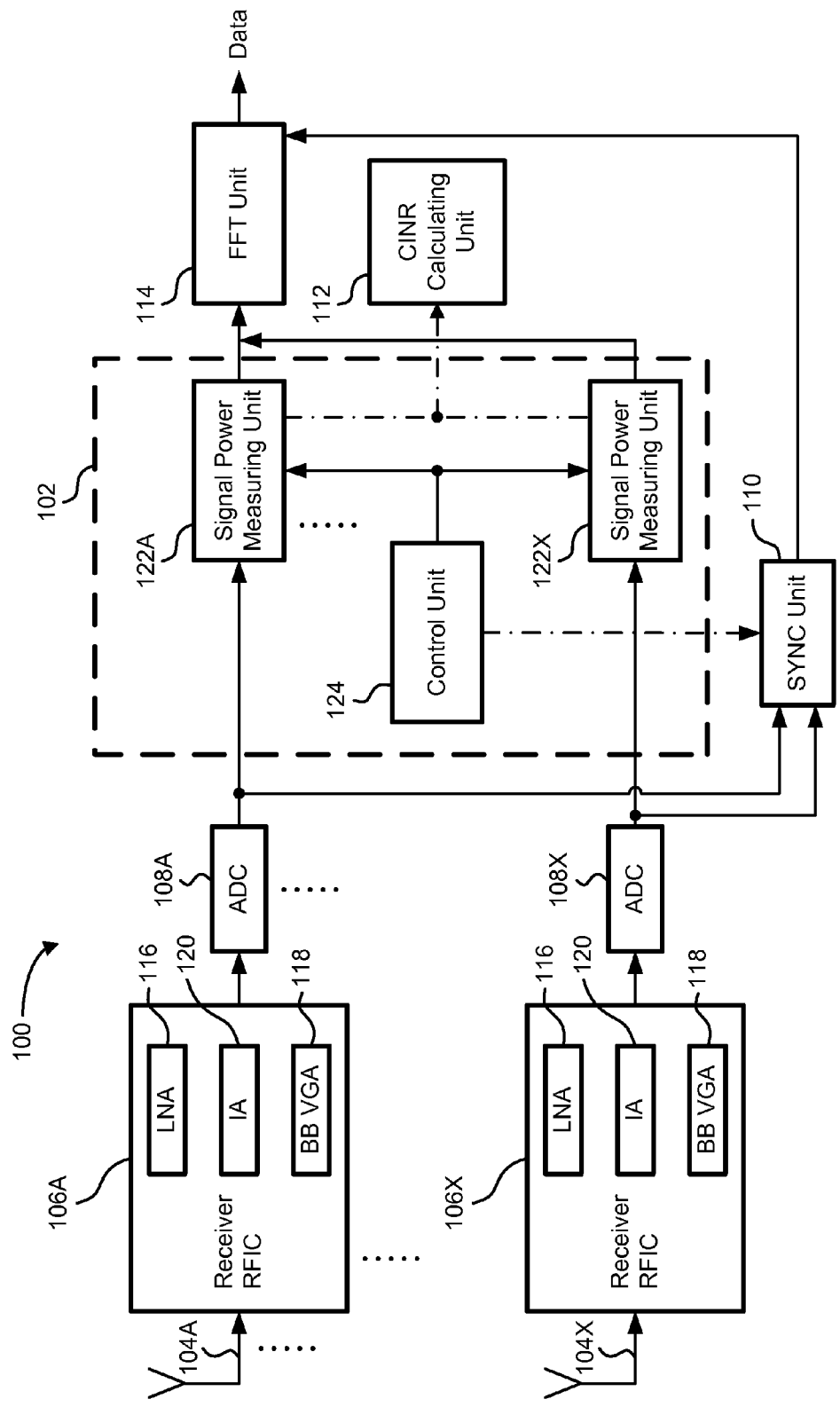
FIG. 1 is a block diagram of an orthogonal frequency-division multiplexing (OFDM) receiver with a digital automatic gain control (AGC) circuit in accordance with an embodiment of the invention.

With reference to FIG. 1, an orthogonal frequency-division multiplexing (OFDM) receiver 100 with a digital automatic gain control (AGC) circuit 102 in accordance with an embodiment of the invention is described. The OFDM receiver 100 is designed to receive and process incoming OFDM signals to extract payload data in the incoming signals. In this embodiment, the OFDM receiver 100 is part of an Orthogonal Frequency Division Multiple Access (OFDMA) wireless communication system based on the IEEE 802.16e standard. Thus, in this embodiment, the OFDM receiver 100 receives and process OFDMA signals. However, in other embodiments, the OFDM receiver 100 may be part of other types of communication systems, which may or may not be based on prescribed standards.

As shown in FIG. 1, the OFDM receiver 100 includes multiple receiver antennas 104A . . . 104X, multiple receiver radio frequency integrated circuits (RFICs) 106A . . . 106X, and multiple analog-to-digital converters (ADCs) 108A . . . 108X, the AGC circuit 102, a synchronization unit 110, a carrier-interference noise ratio (CINR) calculating unit 112 and a fast Fourier transform (FFT) unit 114. In the illustrated embodiment, the OFDM receiver 100 is configured to use multiple-input multiple-output (MIMO) communication technology to receive and process incoming signals on multiple signal paths, which are provided by the multiple receiver antennas 104A . . . 104X, the multiple receiver RFICs 106A . . . 106X, and the multiple ADCs 108A . . . 108X, where each signal path includes one receiver antenna, one receiver RFIC and one ADC that are connected in series. Each signal path of the OFDM receiver 100 may be considered a receiver chain. Thus, in the illustrated embodiment, the OFDM receiver 100 may include multiple receiver chains. The exact number of receiver chains included in the OFDM receiver 100 may vary.

However, in other embodiments, the OFDM receiver 100 may be configured to use other types of communication technology, such as single-input single-output (SISO). Thus, in some embodiments, the OFDM receiver 100 may include only one receiver antenna, one receiver RFICs and one ADC, which provide a single signal path.

Figure 2:
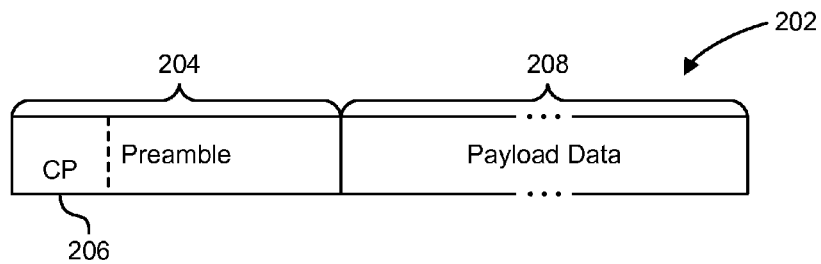
FIG. 2 is a diagram of a data frame that is processed by the OFDM receiver in accordance with an embodiment of the invention.

The receiver RFICs 106A . . . 106X are connected to the receiver antennas 104A . . . 104X, respectively, to receive incoming OFDM signals captured by the antennas. In an embodiment, as illustrated in FIG. 2, the received incoming OFDM signals comprise a number of data frames 202, wherein each data frame includes a preamble 204 with a cyclic prefix (CP) 206 and payload data 208, which is composed of one or more OFDM symbols.

Each of the receiver RFICs 106A . . . 106X is configured to process the received incoming signals so that the payload data of the signals can be properly extracted. In an embodiment, the receiver RFICs 106A . . . 106X are identical devices. Thus, only the receiver RFIC 106A is described herein in detail. However, in other embodiments, the receiver RFICs 106A . . . 106X may not be identical devices. Each of the receiver RFICs 106A . . . 106X is configured to demodulate the received signals, down-convert the demodulated signals and then amplify the down-converted signals for the further processing. Thus, each of the receiver RFICs 106A . . . 106X includes at least one signal amplifier. In an embodiment, as illustrated in FIG. 1, each of the RFICs 106A . . . 106X includes a low-noise amplifier (LNA) 116 and a base-band (BB) variable-gain-amplifier (VGA) 118, which perform 2-step direct gain conversion. In another embodiment, each of the RFICs includes an intermediate amplifier (IA) 120 in addition to the LNA 116 and the BB VGA 118. In this embodiment, the amplifiers 116, 118 and 120 perform 3-step gain conversion. However, in other embodiments, each of the receiver RFICs 106A . . . 106X may include other types of signal amplifiers.

The ADCs 108A . . . 108X of the OFDM receiver 100 are connected to the receiver RFICs 106A . . . 106X, respectively, to receive the amplified signals from the respective receiver RFICs, which are analog signals, and to convert the received signals into digital signals. Thus, the output of the ADCs 108A . . . 108X are digitized signals of the received OFDM signals, which have been amplified in the receiver RFICs 106A . . . 106X.

The AGC circuit 102 of the OFDM receiver 100 is connected to the ADCs 108A . . . 108X to receive and process the digital signals. The AGC circuit 102 operates to measure the power of the digital signals from the ADCs 108A . . . 108X to adjust the signal gains in the receiver RFICs 106A . . . 106X when the measured power varies with a target signal power by a predefined amount. In particular, the AGC circuit 102 adjusts the gains of the amplifiers 116, 118 and/or 120 in the receiver RFICs when needed. The AGC circuit 102 includes a number of signal power measuring units 122A . . . 122X and a control unit 124. The signal power measuring units 122A . . . 122X are connected to the ADCs 108A . . . 108X, respectively, to receive the digital signals from the ADCs. Thus, the signal power measuring units 122A . . . 122X are associated with the receiver RFICs 106A . . . 106X, respectively, which are connected the respective ADCs. Each of the signal power measuring units 122A . . . 122X is configured to measure the signal power of the digital signals from the respective ADC and to compare the measured signal power to a target signal power level to determine when gain adjustment RFIC is needed with respect to the amplifiers in the associated receiver. When a signal power measuring unit determines that the measured signal power varies from the target signal power level by a predetermined amount, the signal power measuring unit informs the control unit 124 so that the control unit can change the gain provided by the receiver RFIC associated with that signal power measuring unit. The signal power measuring units 122A . . . 122X and the control unit 124 of the ACG circuit 102 are described in more detail below.

The synchronization unit 110 of the OFDM receiver 100 is also connected to the ADCs 108A . . . 108X to receive the digital signals from the ADCs. The synchronization unit 110 is configured to perform self-correlation on the received digital signals to detect data frames of the signals. In particular, the synchronization unit 110 is able to detect the preambles of the data frames in the received signals. The synchronization unit 110 may also perform other tasks, such as frequency offset estimation and phase tracking. The synchronization unit 110 is also connected to the AGC unit 102 to receive information relevant to self-correction, as described below.

The CINR calculating unit 112 of the OFDM receiver 100 is connected to the signal power measuring units 122A . . . 122X of the AGC circuit 102 to receive estimated noise floor values, which are used in the calculation of CINR. The output of the CINR calculation unit 112 is transmitted downstream for further processing.

The FFT unit 114 of the OFDM receiver 100 is also connected to the ADCs 108A . . . 108X to receive the digital signals from the ADCs. Although no components are shown on signal paths between the ADCs 108A . . . 108X and the FFT unit 114 in FIG. 1, there may be components (not shown) between the ADCs and the FFT unit, such as a CP removing unit. The FFT unit 114 is also connected to the synchronization unit 110 to receive synchronization information from the synchronization unit so that the FFT unit can properly perform FFT on the received signals. In particular, the FFT unit 114 is configured to apply FFT on N received samples per OFDMA symbol in the detected data frames to generate N received subcarriers per OFDMA symbol in the frequency domain. The output of the FFT unit 114 is transmitted downstream for further processing.

The AGC circuit 102 of the OFDM receiver 100 is described in more detail with reference to FIG. 3, which shows the signal power measuring units 122A . . . 122X and the control unit 124 of the AGC circuit 102. In an embodiment, the signal power measuring units 122A . . . 122X of the AGC circuit 102 are identical. Thus, only the components of the signal power measuring unit 122A is illustrated and described in FIG. 3.

Figure 3:
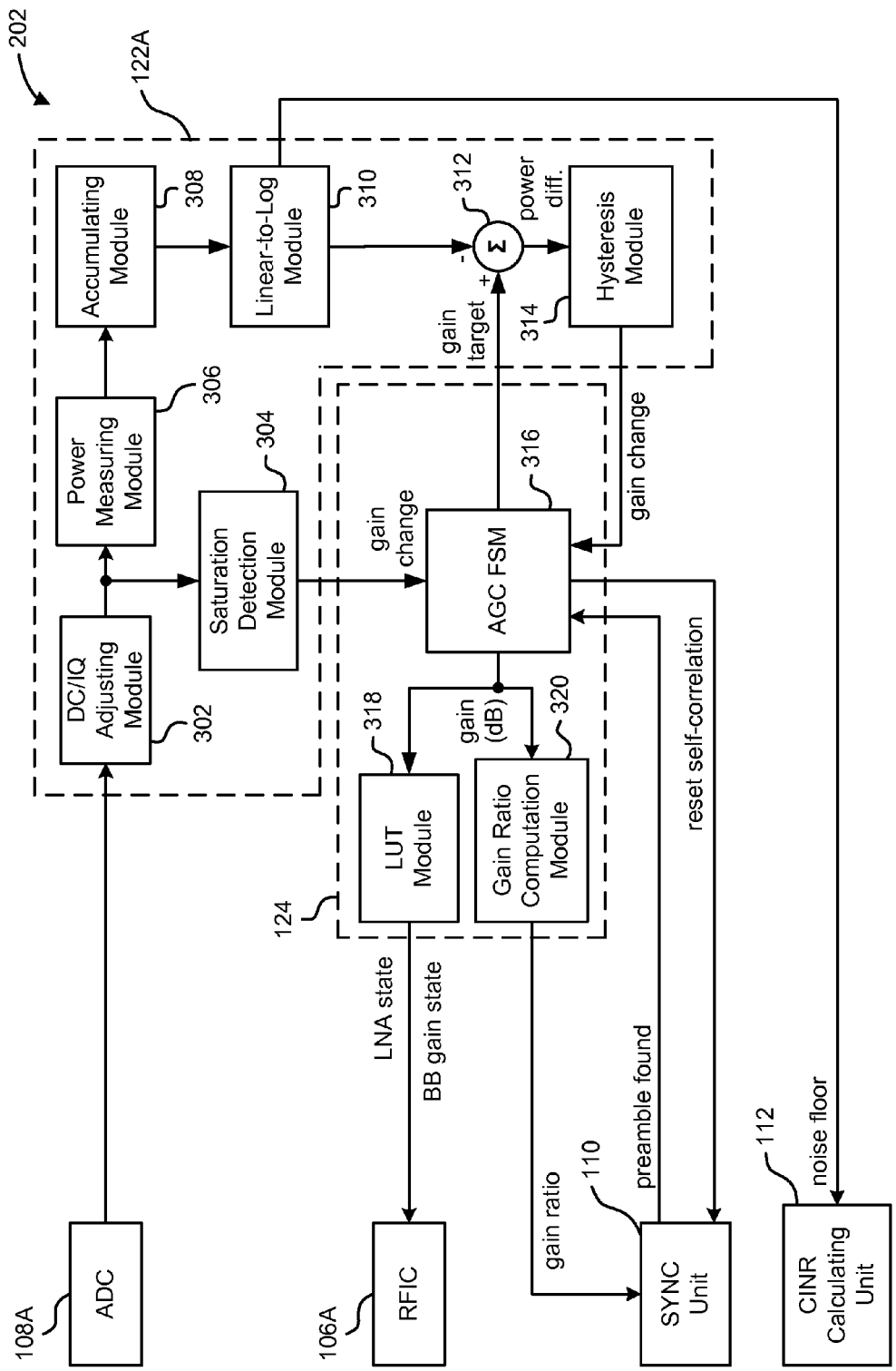
FIG. 3 is a block diagram of the components of the AGC circuit in accordance with an embodiment of the invention.

As shown in FIG. 3, the signal power measuring unit 122A includes a DC/IQ adjusting module 302, a saturation detecting module 304, a power measuring module 306, an accumulating module 308, a linear-to-logarithm converter 310, a summing module 312 and a hysteresis module 314. The DC/IQ adjusting module 302 is connected to the ADC 108A to receive the digital signals from the ADC 108A. The DC/IQ adjusting module 302 is configured to remove DC offset and correct IQ gain and phase imbalance in the digital signals from the ADC 108A. The saturation detecting module 304 is connected to the DC/IQ adjusting module 302 to receive the adjusted signals. The saturation detecting module 304 is configured to detect when the strength of the signals has reached a predetermined upper boundary, i.e., saturated. The saturation detecting module 304 is connected to a MIMO AGC finite state machine (FSM) 316 of the control unit 124 to transmit a saturation signal to the AGC FSM when the strength of the signals is saturated so that the AGC FSM can take appropriate measures. As an example, the AGC FSM 316 may expedite a gain increase or decrease for the amplifiers in the receiver RFIC 106A.

The power measuring module 306 is also connected to the DC/IQ adjusting module 302 to receive the adjusted signals from the DC/IQ adjusting module. The power measuring module 306 is configured to measure the instantaneous power of the adjusted signals from the DC/IQ adjust module 302 to produce a power value. In an implementation, the instantaneous power of the adjusted signals is measured using the following equation: $|I|^2$ and $|Q|^2$, where I is an in phase value and Q is a quadrature value of the received incoming signals.

The accumulating module 308 is connected to the power measuring module 306 to receive measured instantaneous power values from the power measuring module. The accumulating module 308 is configured to accumulate and average the measured power values from the power measuring module 306 over a measurement window to produce an averaged power value. The accumulating module 308 may be configured to use more than one measurement window. In an embodiment, the accumulating module 308 may be configured to use three measurement windows with lengths of T, 2T and 4T, respectively, where T is 0.8 us. Thus, the accumulating module 308 may be configured to average the measured instantaneous power values using multiple window lengths, which are variable, to increase convergence.

The linear-to-logarithm converter 310 is connected to the accumulating module 308 to receive the averaged power values from the accumulating module. The linear-to-logarithm converter 310 is configured to convert the averaged power values to logarithmic averaged power values, e.g., decibel (dB) values.

The summing module 312 is connected to the linear-to-logarithm converter 310 to receive the logarithmic averaged power values from the linear-to-logarithm converter. The summing module 312 is also connected to the AGC FSM 316 to receive a reference target power value in the same logarithmic unit as the logarithmic averaged power values from the linear-to-logarithm converter 310. The summing module 312 compares the logarithmic averaged power values with the reference target power value to produce power difference values. That is, the summing module 312 is configured to subtract each of the logarithmic averaged power values from the reference target power value to produce the power difference values.

As shown in FIG. 3, the CINR calculating unit 112 is also connected to the linear-to-logarithm converter 310 to receive the logarithmic averaged power values from the linear-to-logarithm converter. The received logarithmic averaged power values from the linear-to-logarithm converter 310 are used to determine the noise floor level in the incoming signals, which is used to compute CINR by the CINR calculating unit 112.

The hysteresis module 314 of the signal power measuring unit 122A is connected to the summing module 312 to receive the power difference values from the summing module. The hysteresis module 314 provides an upper threshold and a lower threshold to determine when gain change is needed. If a power difference value is equal to or greater than the upper threshold, the hysteresis module 314 transmits a gain decrease signal to the AGC FSM 316 to indicate that the gain provided by the receiver RFIC 106A needs to be decreased. Similarly, if a power difference value is equal to or smaller than the lower threshold, then the hysteresis module 314 transmits a gain increase signal to the AGC FSM 316 to indicate that the gain provided by the receiver RFIC 106A needs to be increased. In an embodiment, the hysteresis module 314 is Schmitt trigger that provides hysteresis for the received power difference values. However, the hysteresis module 314 is not limited to a Schmitt trigger. The hysteresis provided by the hysteresis module 314 is used to avoid unnecessary gain changes caused by disturbances due to, for example, noise, multi-path and fading with respect to the channel. The hysteresis module 314 may be configured to use multiple hystereses to provide variable upper and lower thresholds. In an embodiment, the hysteresis module 314 may be configured to use three hystereses of $h_1$, $h_2$, $h_3$, respectively, where $h_1 > h_2 > h_3$. The hystereses $h_1$, $h_2$, $h_3$ are used with the corresponding measurement windows of length T, 2T and 4T, respectively, as described below.

As shown in FIG. 3, the control unit 124 includes the AGC FSM 316, a look-up table (LUT) module 318 and a gain ratio computation module 320. The AGC FSM 316 is connected to the different signal power measuring units 122A . . . 122X that are connected to the respective ADCs 108A . . . 108X, which are connected to the respective receiver antennas 104A . . . 104X via the respective receiver RFICs 106A . . . 106X. In particular, the AGC FSM 316 is connected to each of the saturation detecting modules 304 of the signal power measuring units 122A . . . 122X to receive saturation signals from the saturation detecting modules when signal power saturation is detected. The AGC FSM 316 is also connected to each of the summing modules 312 of the signal power measuring units 122A . . . 122X to provide the reference target power signal to the summing modules. The AGC FSM 316 is also connected to each of the hysteresis modules 314 of the signal power measuring units 122A . . . 122X to receive gain change signals from the hysteresis modules when the power difference values exceed the hysteresis provided by the hysteresis modules. The AGC FSM 316 is also connected to the synchronization unit 110 to receive a preamble-found signal when the first preamble of the incoming signals has been detected and to transmit a reset signal to the synchronization unit so that the synchronization unit can reset and start to perform a self-correlation process.

In an embodiment, the AGC FSM 316 may be configured to adjust the reference target power signal based on channel profile estimation. The strength of the incoming OFDM signals varies over time due to both the nature of the signals, i.e., OFDM time domain signals have large peak-to-average ratio, and the nature of the channel, i.e., noise, multi-path and fading. Therefore, the AGC FSM 316 provides the reference target power signal that is below the ADC clipping level to decrease the probability of ADC saturation.

The AGC FSM 316 is also connected to the LUT module 318 and the gain ratio computation module 320 to provide a gain change value in the same logarithmic unit as the logarithmic averaged power values used in the signal power measuring units 122A . . . 122x. The LUT module 318, which is connected to each of the receiver RFICs 106A . . . 106X, is configured to correlate the gain change value from the AGC FSM 316 to a corresponding control signal to instruct or program a given receiver RFIC, either in a parallel manner through pins of the receiver RFIC or in a serial manner through the serial-peripheral-interface (SPI). The gain ratio computation module 320 is configured to compute the gain ratio for the incoming signals at the different antennas 104A . . . 104X using the gain change value from the AGC FSM 316. The computed gain ratio is transmitted to the synchronization unit 110 so that the synchronization unit can take the gain ratio into consideration when performing self-correlation on the incoming signals. In an embodiment, the gain ratio computation module 320 is configured to update the gain ratio for every frame to improve the fading performance of the AGC circuit 102.

The overall operation of the AGC circuit 102 is now described with reference to FIGS. 1-3. The AGC circuit 102 operates in two modes, an acquisition (ACQ) mode and a tracking (TRK) mode. The AGC circuit 102 starts operating in the ACQ mode because the AGC circuit has no prior knowledge on frame boundaries and allocations of the incoming signals. Thus, in the ACQ mode, the AGC circuit 102 keeps tracking the fluctuation of the strength of incoming signal until a preamble is found. Once the preamble is found and frame timing information is extracted from the preamble, the AGC circuit 102 switches to the TRK mode, where the AGC circuit only tracks the signal power over a portion of the cyclic prefix of the preamble for each data frame. Ideally, the AGC circuit 102 should keep monitoring the incoming signals and adjusting the signal gain setting correspondingly. However, because the amplifiers in each of the receiver RFICs 106A . . . 106X require some time to settle down after a gain change, mid-frame gain change is not preferred unless beamforming is implemented. Thus, once the frame timing information is available, the AGC circuit 102 only adjusts the gain setting during the CP of the preamble for each data frame. During rest of the data frame, the AGC circuit 102 freezes the gain setting to allow the amplifiers in each of the receiver RFICs 106A . . . 106X to settle down.

In an embodiment, the AGC circuit 102 is designed to speed up the convergence by: (1) using a single FSM to control (1) using multiple hystereses to avoid unnecessary gain changes due to disturbance; (2) adjusting the initial gain state based on channel profile; (3) using multiple measurement windows; and (4) using optimum gain change and gain re-distribution to avoid LNA change during measurement.

The use of multiple hystereses for the hysteresis module 314 in each of the signal power measuring units 122A . . . 122X increases the convergence speed of the AGC circuit 102 during the ACQ mode. In the ACQ mode, the AGC circuit 102 keeps running until a preamble is found regardless of any large gain change. In other words, the preamble detection performed by the synchronization unit 110 is reset whenever the AGC gain state is changed. On the other hand, the AGC circuit 102 cannot freeze its gain unless the preamble is found. Therefore, a possible worst case scenario is that the AGC circuit 102 keeps changing its gain state and the preamble can never be found. In order to solve this problem, the hysteresis module 314 provides a hysteresis to avoid small gain fluctuations. However, there is a trade-off between performance and speed. The smaller the hysteresis, the closer the AGC gain is to the ideal one, but the slower the convergence of the AGC circuit 102 because the AGC circuit is more vulnerable to channel disturbance, which means that it could take several frames to find the preamble. Thus, the hysteresis should be set such that the AGC circuit 102 can converge within the CP of the preamble of the first data frame with high possibility, and only minor performance degradation is observed compared to the ideal AGC case. In order to further speed up the AGC circuit 102 during the ACQ mode, multiple hystereses are used. In an embodiment, three hystereses of $h_1$, $h_2$, $h_3$, respectively, where $h_1 > h_2 > h_3$. As an example, $h_1$, $h_2$, $h_3$ may be 5 dB, 4 dB, 3 dB, respectively. The underlying rationale for using multiple hystereses is that if small power variations are observed within a few consecutive measurement windows, it is highly likely that the AGC circuit 102 has already converged to the appropriate gain state. Thus, the hysteresis should be increased to discourage the AGC circuit 102 to change its gain state.

The adjustment of the initial gain state based on channel profile also increases the convergence speed of the AGC circuit 102 during the TRK mode. In the TRK mode, the AGC circuit 102 freezes its gain most of the time except a short period of time within the CP of the preamble in each data frame. Within this short period, the AGC circuit 102 measures the signal strength and adjusts its gain setting if necessary. Unlike the ACQ mode where the AGC circuit 102 has no prior knowledge on the signal power, the AGC circuit now has knowledge of the gain setting for the previous frame, which can be used as the initial gain state for the current frame. However, the signal power from frame to frame can be quite different because of fading. Thus, the initial gain of a frame may be several dB back-off, which depends on the channel profile, from the previous gain setting because it is faster to increase the gain than to decrease the gain.

The use of multiple measurement windows for the accumulating module 308 in each of the signal power measuring units 122A . . . 122X also increases the convergence speed of the AGC circuit 102. In order to speed up the AGC circuit 102, it is desirable to detect the need for gain change as soon as possible, and thus, a short measurement window is preferred. On the other hand, due to channel disturbance, the signal strength within a short measurement window varies more significantly. Therefore, the design criterion is that the shorter the measurement window, the larger the hysteresis. In an embodiment, the accumulating module 308 in each of the signal power measuring units 122A . . . 122X uses three measurement windows with lengths of T, 2T and 4T, respectively, where T is 0.8 us. In operation, the AGC circuit 102 starts with the shortest measurement window of T so that, if the difference between the measured power and the gain target is larger than the hysteresis, gain change is used. Otherwise, the AGC circuit 102 keeps accumulating power values over a longer measurement window of 2T and computes the power difference value. If again the power difference is smaller than the hysteresis, the power values over a measurement window of 4T are accumulated and the power difference value is computed. This process can speed up the AGC circuit 102, especially in the TRK mode because only limited resource is available. During this process, the gain target, i.e., the reference target gain value provided by the AGC FSM 316, can also be adjusted based on measurement window size and channel profile.

The use of optimum gain change and gain re-distribution to avoid LNA change during measurement also increases the convergence speed of the AGC circuit 102. Typically, receiver RFICs contain both an LNA gain and a BB VGA gain, and the LNA gain change usually introduces a large DC component and takes longer time to settle. Because the time budget for the AGC circuit 102 is usually very limited, it is preferable if the LNA gain change could be avoided. Consequently, if possible, during mid-frame only the BB VGA gain is changed. Therefore, if more than one LNA/BB VGA gain combination can lead to the same gain setting, the AGC circuit 102 would prefer the one with the same LNA gain setting as the current setting. However, this LNA/BB VGA gain state may cause the LNA gain change inevitable within the next frame. Thus, a gain re-distribution among LNA and BB VGA is performed during the frame gap such that the new gain combination setting minimizes the chance of LNA gain change in the coming frame. Also, when re-distributing the gain combinations, the mapping between radio signal strength indicator (RSSI) information and its optimal gain combination is looked up, which typically is provided by the receiver RFICs 106A . . . 106X.

The complexity of a multi-chain AGC circuit depends mainly on FSMs. One straight-forward implementation is to use independent FSM for each data-path. However, the complexity of such implementation with respect to the number of states in the FSM grows exponentially as the number of receiver antennas increases. Also, this makes the verification quite difficult. The use of a common FSM, i.e., the AGC FSM 316 of the AGC circuit 102, reduces the complexity of the AGC circuit. The AGC FSM 316 is a multi-chain FSM that always places all the receiver chains in the same state. For example, if gain change is issued at one chain and that chain goes to a "wait" state, the other chains are in the "wait" state as well even though they did not have gain changes and do not need to wait for LNA/BB VGA gain and DC to settle down. Thus, the AGC FSM 316 can be considered to be synchronous.

Figure 4:
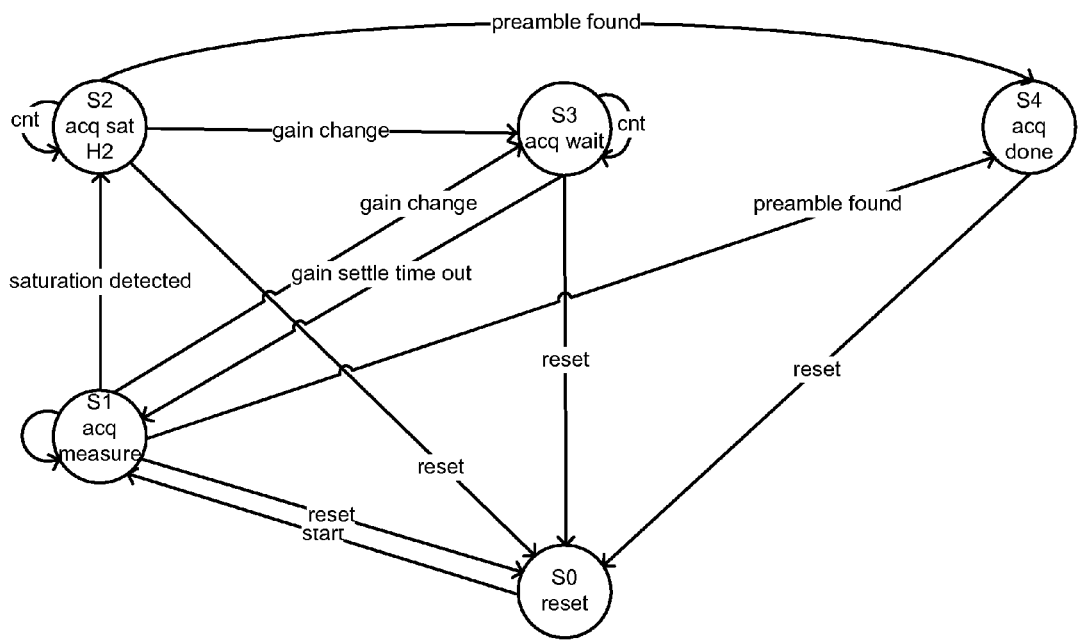
FIG. 4 is a state transition diagram of an AGC finite state machine (FSM) of the AGC circuit during the acquisition (ACQ) mode in accordance with an embodiment of the invention.
Figure 5:
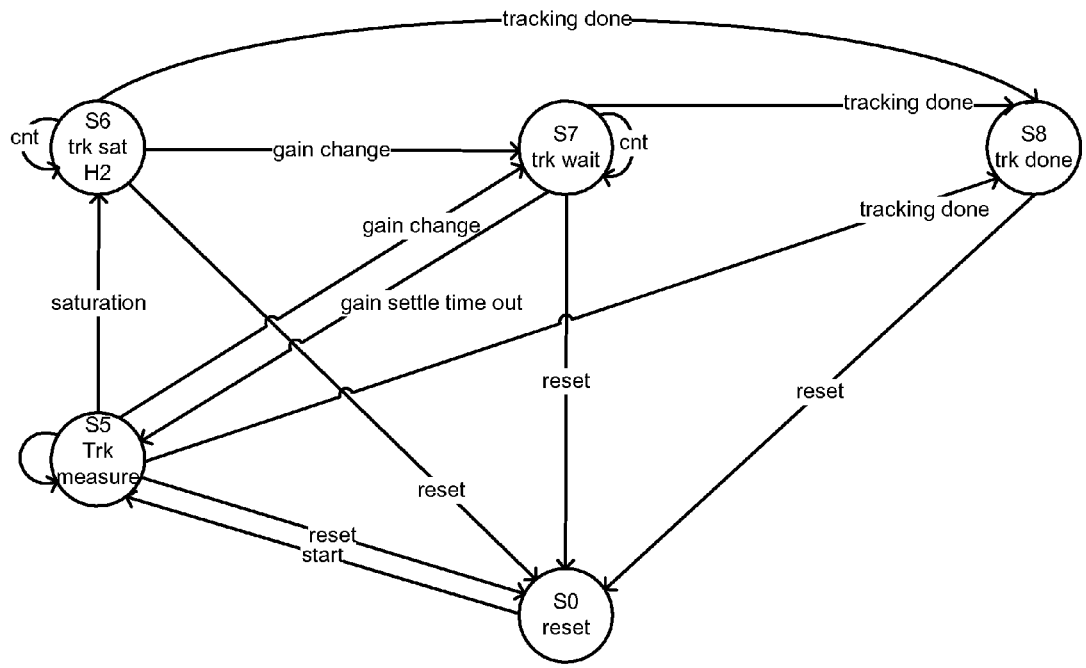
FIG. 5 is a state transition diagram of the AGC FSM during the tracking (TRK) mode in accordance with an embodiment of the invention.
Figure 6:
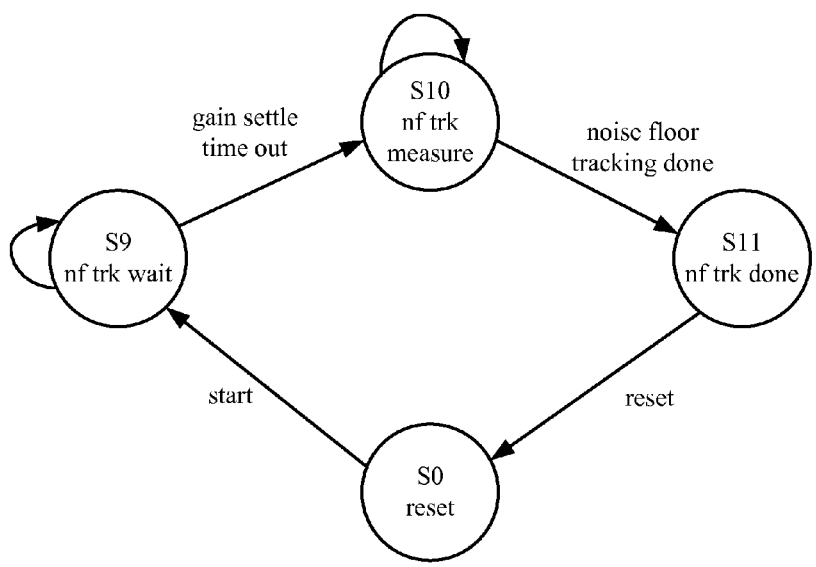
FIG. 6 is a state transition diagram of the AGC FSM during noise-floor tracking in accordance with an embodiment of the invention.

The operation of the AGC circuit 102 is further described with reference to FIGS. 4-6, which are state transition diagrams of the AGC FSM. FIG. 4 is a state transition diagram of the AGC FSM 316 during the ACQ mode in accordance with an embodiment of the invention. FIG. 5 is a state transition diagram of the AGC FSM 316 during the TRK mode in accordance with an embodiment of the invention. FIG. 6 is a state transition diagram of the AGC FSM 316 during noise-floor tracking in accordance with an embodiment of the invention. As shown in FIG. 4, State S0 is the reset state for the AGC FSM 316. The AGC FSM 316 can transition to State S0 from States S1, S2, S3 and S4. From State S0, the AGC FSM 316 transitions to State S1, where acquisition measurement is performed. The acquisition measurement involves measuring the power of the incoming signals, accumulating and averaging the measured power over a measurement window, and comparing the result with a gain target using hysteresis to determine if gain change is needed. The acquisition measurement is performed by the DC/IQ adjusting module 302, the power measuring module 306, the accumulating module 308, the linear-to-logarithm converter 310, the summing module 312 and the hysteresis module 314 of the signal power measuring units 122A . . . 122X of the AGC circuit 102. From State S1, the AGC FSM 316 can transition to State S2, S3 or S4. If saturation is detected by the saturation detecting module 304, the AGC FSM 316 transitions from State S1 to State S2. If gain change is executed due to the comparison of the averaged power and the gain target, the AGC FSM 316 transitions from State S1 to State S3, where the AGC FSM waits while count is valid to let the affected LNA and BB VGA time to settle. If a preamble is found by the synchronization unit 110, the AGC FSM 316 transitions from State S1 to State S4, where the acquisition ends. State S2 is added to speed up the gain adjustment under the scenarios that the signals are heavily saturated. If the signals are deeply saturated, one single gain drop may not be enough. Instead of waiting for the gain change to settle down and then detecting another saturation, which takes longer time, a time counter is activated when saturation is detected to observe the signal strength over a longer window than the initial saturation detection. If saturation is detected, it is therefore highly possible that the signals are deeply saturated and more gain drop is issued. From State S2, the AGC FSM 316 transitions to State S3 if gain change is executed due to second saturation, or if timer for second saturation detection expires. Also from State S2, the AGC FSM 316 transitions to State S4 if a preamble is found. From State S3, the AGC FSM transitions back to State S1 when the count is invalid, i.e., gain settle time has passed. As illustrated in FIG. 4, the ACQ mode terminates once the preamble is found.

Once the preamble is found, the ACG FSM 316 switches to the TRK mode. As shown in FIG. 5, State S0 is the reset state for the AGC FSM 316. The AGC FSM 316 can transition to State S0 from States S5, S6, S7 and S8. From State S0, the AGC FSM 316 transitions to State S5, where tracking measurement is performed. The tracking measurement is performed in a similar manner as the acquisition measurement. From State S5, the AGC FSM 316 can transition to State S6, S7 or S8. If saturation is detected, the AGC FSM 316 transitions from State S5 to State S6. If gain change is executed due to the comparison of the averaged power and the gain target, the AGC FSM 316 transitions from State S5 to State S7, where the AGC FSM waits while count is valid to let the affected LNA and BB VGA time to settle. If tracking has been completed, i.e., a predefined tracking time has elapsed, the AGC FSM 316 transitions from State S5 to State S8, where the tracking ends. State S6 is added to speed up the gain adjustment under the scenarios that the signals are heavily saturated. If the signals are deeply saturated, one single gain drop may not be necessary. Instead of waiting for the gain change to settle down and then detecting another saturation, which takes longer time, a time counter is activated when saturation is detected to observe the signal strength over a longer window then the initial saturation detection. If saturation is detected, it is therefore highly possible that the signals are deeply saturated and more gain drop is issued. From State S6, the AGC FSM 316 transitions to State S7 if gain change is executed due to second saturation, or if timer for second saturation detection expires. Also from State S6, the AGC FSM 316 transitions to State S8 if tracking has been completed. From State S7, the AGC FSM 316 transitions back to State S5 when the count is invalid, i.e., gain settle time has passed. Also from State S7, the AGC FSM 316 transitions to State S8 if tracking has been completed. As illustrated in FIG. 5, the TRK mode terminates once the tracking time has elapsed.

The states of the AGC FSM 316 during noise-floor tracking is described with reference to FIG. 6. As shown in FIG. 6, State S0 is the reset state for the AGC FSM 316. The AGC FSM 316 can transition to State S0 from State S11. From State S0, the AGC FSM 316 transitions to State S9, where noise-floor tracking is suspended. Thus, the AGC FSM 316 waits with respect to noise-floor tracking. If noise-floor tracking is enabled, the AGC FSM 316 transitions to State S9 after receiver chains are activated. After the initial gain settle time has passed, the AGC FSM 316 transitions to State S10, where noise-floor tracking measurement is performed. The noise-floor tracking measurement is performed in a similar manner as the acquisition or tracking measurement for gain control. From State S10, the AGC FSM 316 transitions to State S11 after the noise-floor tracking measurement has been completed, for example, after a predefined time interval has elapsed, where the noise-floor tracking end. In an embodiment, the noise-floor tracking is performed between data frames, as described in more detail below.

Figure 7:
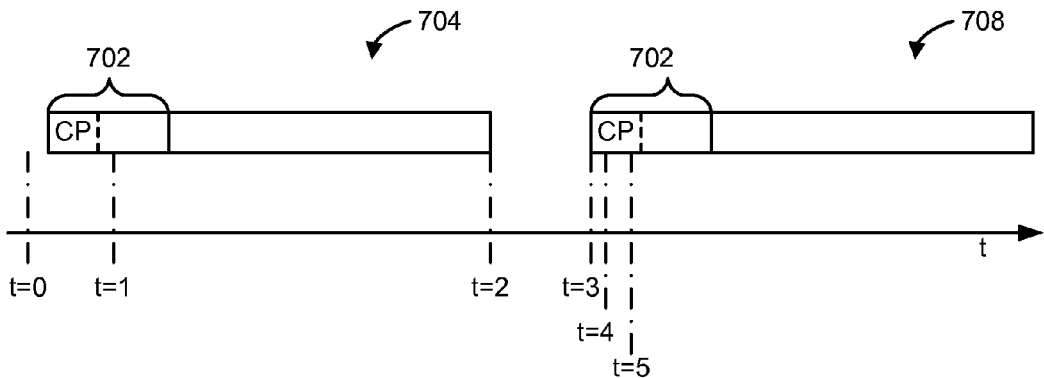
FIG. 7 is a timing diagram showing the timing of ACQ and TRK measurements for AGC and noise-floor measurements performed by the AGC circuit in accordance with an embodiment of the invention.

Turning now to FIG. 7, the timing of ACQ and TRK measurements for AGC and noise-floor measurements performed by the AGC circuit 102 is shown. The AGC ACQ measurement begins when the AGC circuit is activated at t=0 until a preamble 702 of a data frame 704, i.e., the first preamble, is found at t=t1. The ACG circuit 102 does not perform any AGC operation for rest of the data frame 704. A nose-floor tracking measurement is performed between t=t2 and t=t3, which are between the data frame 704 and the next data frame 708. Another noise-floor tracking measurement may be performed between subsequent data frames. An AGC TRK measurement begins at t=t4 and ends at t=5, which are within the CP of the data frame 708. Thus, the AGC TRK measurement is performed during a small portion of the CP of the data frame 708. In an embodiment, the duration between t=t4 and t=t5 is 7 µs. The AGC circuit 102 does not perform any AGC operation for rest of the data frame 708. The AGC circuit 102 performs the AGC TRK measurement during the CP of subsequent data frames (not shown).

Figure 8:
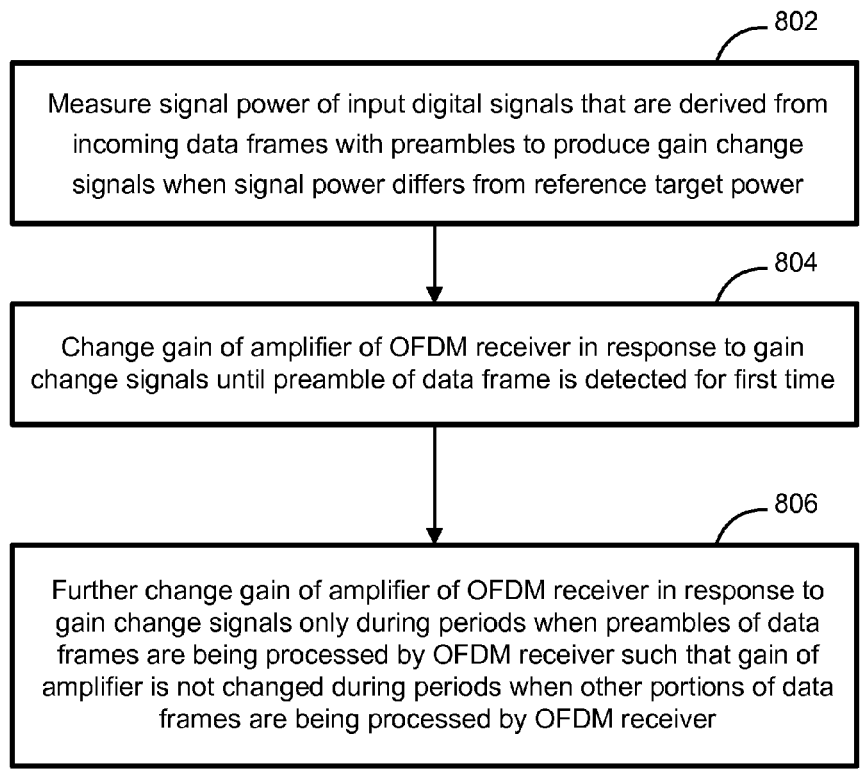
FIG. 8 is a process flow diagram of a method for performing AGC for an OFDM receiver in accordance with an embodiment of the invention.

A method for performing AGC for an OFDM receiver in accordance with an embodiment of the invention will be described with reference to a flow diagram of FIG. 8. At block 802, signal power of input digital signals that are derived from incoming data frames with preambles is measured to produce gain change signals when the signal power differs from a reference target power. Next, at block 804, the gain of an amplifier of the OFDM receiver is changed in response to the gain change signals until a preamble of the data frames is detected for the first time. Next, at block 806, the gain of the amplifier of the OFDM receiver is further changed in response to the gain change signals only during periods when the preambles of the data frames are being processed by the OFDM receiver such that the gain of the amplifier is not changed during periods when other portions of the data frames are being processed by the OFDM receiver.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. An automatic gain control (AGC) circuit for an orthogonal frequency-division multiplexing (OFDM) receiver comprising:
    a signal power measuring unit configured to measure signal power of input digital signals that are derived from incoming data frames with preambles, the signal power measuring unit being configured to produce gain change signals when the signal power differs from a reference target power level;
    a finite state machine operably connected to the signal power measuring unit to receive the gain change signals, the finite state machine being configured to change the gain of an amplifier of the OFDM receiver in response to the gain change signals until a preamble of the data frames is detected for the first time, the finite state machine being further configured to change the gain of the amplifier in response to the gain change signals, after the preamble is detected, only during periods when the preambles of the data frames are being processed by the OFDM receiver such that the gain of the amplifier is not changed during periods when other portions of the data frames are being processed by the OFDM receiver; and
    at least one additional signal power measuring unit, each of the signal power measuring unit and the at least one additional signal power measuring unit being connected a receiver chain, the finite state machine being a synchronous MIMO finite state machine configured to control the signal power measuring unit and the at least one additional power measuring unit and to receive the gain change signals from the signal power measuring unit and the at least one additional power measuring unit.

2. The AGC circuit of claim 1 wherein each of the signal power measuring unit and the at least one additional signal power measuring unit includes a saturation detecting module to detect power saturation at each receiver chain.

3. The AGC circuit of claim 1 wherein the signal power measuring unit includes an accumulation module configured to average instantaneous power using multiple variable window lengths.

4. The AGC circuit of claim 3 wherein the signal power measuring unit further includes a hysteresis module configured to provide variable upper and lower thresholds for producing the gain change signals.

5. The AGC circuit of claim 1 further comprising a gain ratio computation module configured to update a gain ratio for every frame of the input digital signals.

6. The AGC circuit of claim 1 wherein the finite state machine is configured to adjust the reference target power level based on channel profile estimation.

7. The AGC circuit of claim 1 wherein the finite state machine is configured to only adjust a low-noise amplifier gain during mid-frame.

8. A method for performing automatic gain control (AGC) for an orthogonal frequency-division multiplexing (OFDM) receiver, the method comprising:
  measuring signal power of input digital signals that are derived from incoming data frames with preambles to produce gain change signals when the signal power differs from a reference target power level, wherein the measuring includes averaging instantaneous power using multiple variable window lengths;
  changing the gain of an amplifier of the OFDM receiver in response to the gain change signals until a preamble of the data frames is detected for the first time; and
  further changing the gain of the amplifier of the OFDM receiver in response to the gain change signals, after the preamble is detected, only during periods when the preambles of the data frames are being processed by the OFDM receiver such that the gain of the amplifier is not changed during periods when other portions of the data frames are being processed by the OFDM receiver.

9. The method of claim 8 wherein the measuring further includes providing variable upper and lower hysteresis thresholds for producing the gain change signals.

10. The method of claim 8 further comprising computing a gain ratio for every frame of the input digital signals.

11. The method of claim 8 further comprising adjusting the reference target power level based on channel profile estimation.

12. The method of claim 8 wherein the further changing includes adjusting only a low-noise amplifier gain during mid-frame.

13. The method of claim 8 wherein the measuring is performed for each of multiple receiver chains, and wherein the changing and the further changing are performed by a single synchronous MIMO finite state machine for all the multiple receiver chains.

14. The method of claim 13 further comprising detecting power saturation for each of the multiple receiver chains.

15. An orthogonal frequency-division multiplexing (OFDM) receiver comprising:
  a plurality of receiver radio frequency integrated circuits (RFICs) connected to respective antennas, each of the RFICs including at least one amplifier, each of the RFICs being part of a receiver chain; and
  an automatic control (AGC) circuit configured to change the gain of the at least one amplifier in each of the RFICs, the AGC circuit comprising:
    a plurality of signal power measuring units connected to the RFICs, each of the signal power measuring units being configured to measure signal power of input digital signals that are derived from incoming data frames with preambles, the signal power measuring unit being configured to produce gain change signals when the signal power differs from a reference target power level; and
    a synchronous multiple-input multiple-output (MIMO) finite state machine operably connected to the signal power measuring units to receive the gain change signals, the synchronous MIMO finite state machine being configured to change the gain of the at least one amplifier in each of the RFICs in response to the gain change signals until a preamble of the data frames is detected for the first time, the synchronous MIMO finite state machine being further configured to change the at least one amplifier in each of the RFICs in response to the gain change signals, after the preamble is detected, only during periods when the preambles of the data frames are being processed such that the gain of the at least one amplifier in each of the RFICs is not changed during periods when other portions of the data frames are being processed.

16. The OFDM receiver of claim 15 wherein each of the signal power measuring units includes a saturation detecting module to detect power saturation at each receiver chain.

17. The OFDM receiver of claim 15 wherein each of the signal power measuring units includes an accumulation module configured to average instantaneous power using multiple variable window lengths.

18. The OFDM receiver of claim 17 wherein each of the signal power measuring units includes a hysteresis module configured to provide variable upper and lower thresholds for producing the gain change signals.

19. The OFDM receiver of claim 15 wherein the AGC circuit further includes a gain ratio computation module configured to update a gain ratio for every frame of the input digital signals.

20. The OFDM receiver of claim 15 wherein the synchronous MIMO finite state machine is configured to adjust the reference target power level based on channel profile estimation.

21. An automatic gain control (AGC) circuit for an orthogonal frequency-division multiplexing (OFDM) receiver comprising:
  a signal power measuring unit configured to measure signal power of input digital signals that are derived from incoming data frames with preambles, the signal power measuring unit being configured to produce gain change signals when the signal power differs from a reference target power level, wherein the signal power measuring unit includes an accumulation module configured to average instantaneous power using multiple variable window lengths; and
  a finite state machine operably connected to the signal power measuring unit to receive the gain change signals, the finite state machine being configured to change the gain of an amplifier of the OFDM receiver in response to the gain change signals until a preamble of the data frames is detected for the first time, the finite state machine being further configured to change the gain of the amplifier in response to the gain change signals, after the preamble is detected, only during periods when the preambles of the data frames are being processed by the OFDM receiver such that the gain of the amplifier is not changed during periods when other portions of the data frames are being processed by the OFDM receiver.

22. The AGC circuit of claim 21 wherein the signal power measuring unit further includes a hysteresis module configured to provide variable upper and lower thresholds for producing the gain change signals.

23. A method for performing automatic gain control (AGC) for an orthogonal frequency-division multiplexing (OFDM) receiver, the method comprising:
    measuring signal power of input digital signals that are derived from incoming data frames with preambles to produce gain change signals when the signal power differs from a reference target power level,
    changing the gain of an amplifier of the OFDM receiver in response to the gain change signals until a preamble of the data frames is detected for the first time; and
    further changing the gain of the amplifier of the OFDM receiver in response to the gain change signals, after the preamble is detected, only during periods when the preambles of the data frames are being processed by the OFDM receiver such that the gain of the amplifier is not changed during periods when other portions of the data frames are being processed by the OFDM receiver,
    wherein the measuring is performed for each of multiple receiver chains, and wherein the changing and the further changing are performed by a single synchronous MIMO finite state machine for all the multiple receiver chains.

24. The method of claim 23 further comprising detecting power saturation for each of the multiple receiver chains.

* * * * *